United States Patent
Park

(10) Patent No.: US 7,405,973 B2
(45) Date of Patent: Jul. 29, 2008

(54) REPAIR CIRCUIT OF SEMICONDUCTOR MEMORY DEVICE

(75) Inventor: Young Soo Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 190 days.

(21) Appl. No.: 11/485,281

(22) Filed: Jul. 13, 2006

(65) Prior Publication Data

US 2007/0081402 A1   Apr. 12, 2007

(30) Foreign Application Priority Data

Oct. 10, 2005   (KR) ..................... 10-2005-0094912

(51) Int. Cl.
*G11C 11/34*   (2006.01)
*G11C 16/06*   (2006.01)

(52) U.S. Cl. .................................. 365/185.09; 365/200

(58) Field of Classification Search ............ 365/185.09, 365/200, 230.08, 230.09
See application file for complete search history.

(56) References Cited

U.S. PATENT DOCUMENTS 6,144,592 A * 11/2000 Kanda ........................ 365/200
2002/0044489 A1 * 4/2002 Kim ............................ 365/200
2005/0226065 A1 * 10/2005 Yoon et al. .................. 365/200

FOREIGN PATENT DOCUMENTS

KR   1020030002636   1/2003
KR   1020050073232   7/2005

OTHER PUBLICATIONS

Patent Gazette for KR 10-0739253. (Jul. 2007).

* cited by examiner

*Primary Examiner*—Richard T. Elms
*Assistant Examiner*—Toan Le
(74) *Attorney, Agent, or Firm*—Lowe Hauptman Ham & Berner LLP

(57) ABSTRACT

An embodiment of the present invention relates to a repair circuit of a semiconductor memory device. The repair circuit includes an address counter that sequentially generates a first column address signal and a second column address signal in response to a write enable signal or a read enable signal, a repair controller that generates a repair column address signal earlier than the second column address signal in response to the first column address signal, an address latch enable signal, a command enable signal, and a write enable signal, and a repair scramble unit that selects a repair cell in response to a repair I/O control signal and the repair column address signal. If an address on which a repair operation must be performed occurs, the repair controller directly receives the write enable signal or the read enable signal and activates the repair controller earlier than a general cell using a previous address, thereby offsetting an operating time consumed in the repair controller. Therefore, the operating speed of the repair cell can become faster than that of the general cell and the operating speed of the device can be improved accordingly.

6 Claims, 4 Drawing Sheets

REPAIR CIRCUIT OF SEMICONDUCTOR MEMORY DEVICE

BACKGROUND

1. Field of the Invention

The present invention generally relates to a repair circuit of a semiconductor memory device, and more particularly, to a repair circuit of a semiconductor memory device, in which it can prevent a repair cell from operating slower than a normal memory cell.

2. Discussion of Related Art

A semiconductor memory device does not function as a memory device if even one of many delicate cells fails. To discard the whole device as a failed product despite the fact that only several cells within the memory have failed, however, is inefficient in terms of the yield.

Currently, the memory device is restored by replacing a failed normal unit cell with a reservation unit cell that is previously provided in the memory device in order to improve the yield.

FIG. 1 is a block diagram illustrating the process of performing the repair operation in the related art. FIG. 2 is a timing diagram of signals illustrating the address generating operation in the related art. The address generating process and the repair operation principle of the NAND flash memory device in the related art will be described below with reference to FIGS. 1 and 2.

(1) Address Generating Process of NAND Flash Memory Device

The NAND flash memory device does not include address pins since the I/O of data is performed serially. Furthermore, addresses are generated by a write enable signal WE# or a read enable signal RE#.

An address start signal is first input through an ALE (Address Latch Enable) pin and the I/O. The ALE pin is a pin for address input. The write enable signal WE# is input to an address counter. The address counter increases the address whenever the write enable signal WE# is toggled. The address counter also increases the internal address by detecting the rising edge of the write enable signal WE# within the chip. When it is sought to output data, the address is increased in the same manner as above using the read enable signal RE#.

If the write enable signal WE# or the read enable signal RE# is input to the input terminal, the address counter increases the address.

The increased address COLADD or ROWADD must be transferred to a cell operation block (a repair controller,) within the chip. Eventually, a column address signal COLADDC[j] is generated by an address counter when a write enable signal WE# or a read enable signal being inputted through an input terminal is inputted to the address counter. It takes a time Tadd for the column address signal to reach the cell operation block (a repair controller). As a result, the time taken for a repair address signal RADD to reach the repair scramble unit is longer than is the time taken for a column address signal COLADD[j] to reach the address scramble by the time taken for the repair address signal RADD generated in the repair controller to reach the repair scramble. This causes the operating speed of the repair cell to be later than that of the normal memory cell.

(2) Repair Operation

In the normal memory cell or the repair cell, input or output of the data is performed according to the address change. However, to perform the repair operation, addresses to be repaired must be compared and I/O to be repaired must be set. This operation is performed by the repair controller.

If a new address is input when data are output, the data I/O operation is performed by the page buffer in the case of a general cell. In the case of a repair cell, however, the I/O operation is performed according to control signals (a signal RIO to indicate I/O to be repaired, an address RADD to indicate a repair column), which are generated by the repair controller.

Therefore, the operation of the repair cell becomes later than the operation of the general cell by a time during which the repair controller is activated and is transmitted to the repair scramble. As a result, the operating speed of the repair cell defines the operating speed of the chip.

There is a limit to a reduction of a time which is taken for the repair controller to operate. If the spec defining the data I/O time is reduced, the desirable spec of the device cannot be obtained due to the operating time of the repair controller.

For example, in the case of a 512 Mb NAND flash memory, the time taken to input and output one byte is 50 ns. In the case of a 2 Gb NAND flash memory, the time taken to input and output one byte is 30 ns, and in the case of 4 Gb, 25 ns. However, in the 512 Mb, 2 Gb, and 4 Gb, the operating time of the repair controller is the same or longer. Therefore, they do not satisfy the spec of the device for the I/O time.

SUMMARY OF THE INVENTION

An embodiment of the present invention is that it provides a repair circuit of a semiconductor memory device, in which if an address on which a repair operation must be performed occurs, the operating speed of the repair cell is made faster than that of a normal cell, thereby improving the operating speed of the device.

A repair circuit of a semiconductor memory device according to an embodiment of the present invention includes an address counter that sequentially generates a first column address signal and a second column address signal in response to a write enable signal or a read enable signal, a repair controller that generates a repair column address signal earlier than the second column address signal in response to the first column address signal, an address latch enable signal, a command enable signal, and a write enable signal, and a repair scramble unit that selects a repair cell in response to a repair I/O control signal and the repair column address signal.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 1:
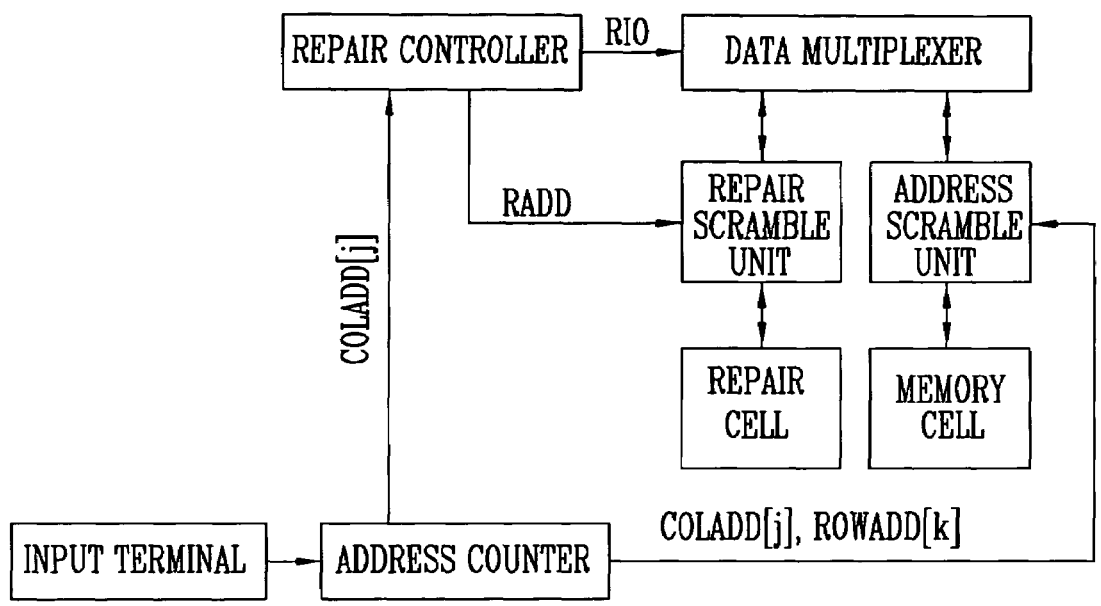
FIG. 1 is a block diagram of the repair circuit of the semiconductor memory device in the related art.
Figure 2:
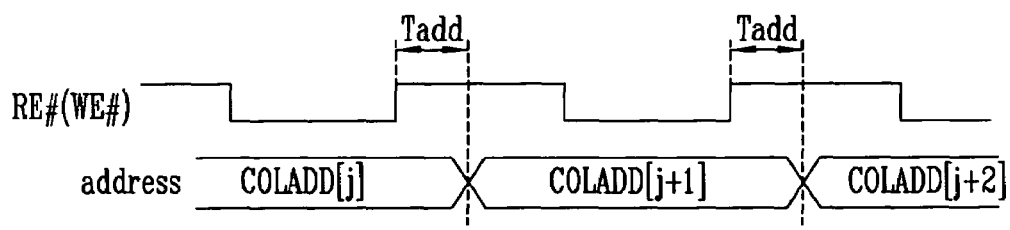
FIG. 2 is a timing diagram of signals illustrating the address generating operation of the semiconductor memory device in the related art.
Figure 3:
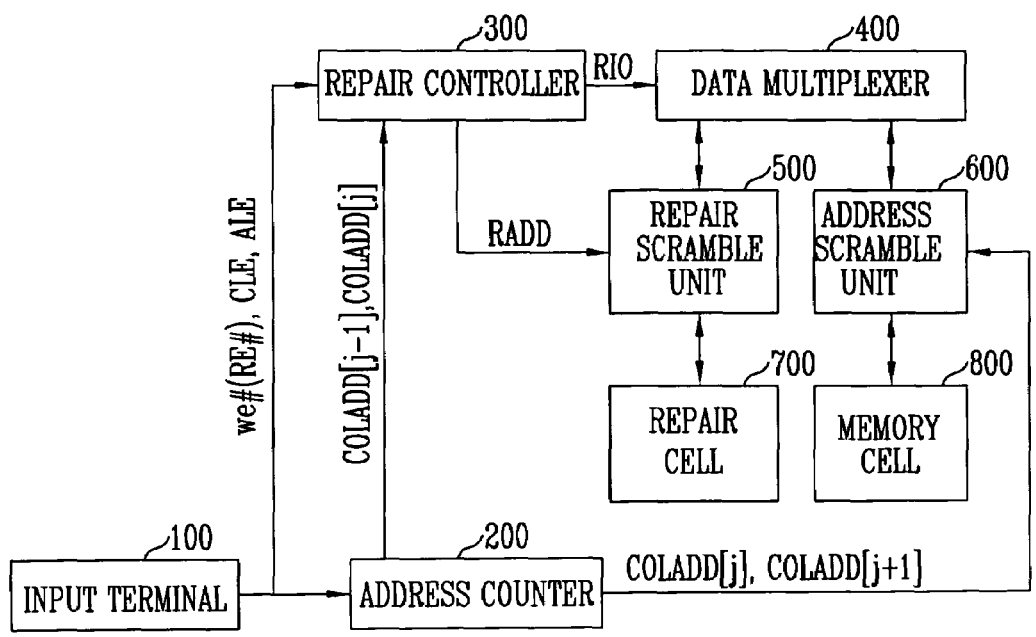
FIG. 3 is a block diagram of a repair circuit of a semiconductor memory device according to an embodiment of the present invention.

FIG. 3 is a block diagram of a repair circuit of a semiconductor memory device according to an embodiment of the present invention.

Referring to FIG. 3, input signals (i.e., a write enable signal WE# or a read enable signal RE#, an address latch enable signal ALE, and a command latch enable signal CLE) are input through an input terminal 100, and are then transmitted to an address counter 200 and a repair controller 300.

The address counter 200 outputs column address signals COLADD[j], COLADD[j+1] whose addresses have been increased whenever the write enable signal WE# or the read enable signal RE# is toggled.

The repair controller 300 outputs a repair control signal RIO and a repair address signal RADD in response to the write enable signal WE# or the read enable signal RE#, the address latch enable signal ALE, and the command latch enable signal CLE which are applied through the input terminal 100, and the column address signals COLADD[j−1] output from the address counter 300.

A data multiplexer 400 controls the data I/O of a repair scramble unit 500 and an address scramble unit 600 in response to the repair control signal RIO output from the repair controller 300.

The repair scramble unit 500 selects a bit line of a corresponding repair cell by performing an address decoding operation in response to the repair address signal RADD output from the repair controller 300.

The address scramble unit 600 selects a bit line of a corresponding memory cell by performing an address decoding operation in response to the column address signal COLADD[j] output from the address counter 200.

Figure 4:
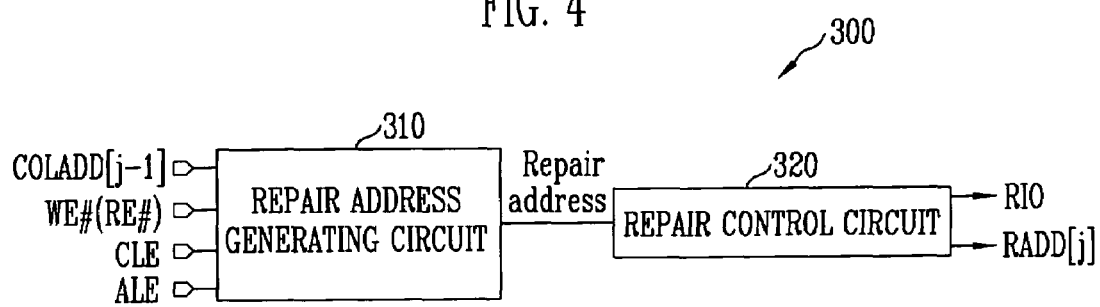
FIG. 4 is a block diagram of the repair controller shown in FIG. 3.

FIG. 4 is a block diagram of the repair controller 300 shown in FIG. 3.

The repair controller 300 includes a repair address generating circuit 310 and a repair control circuit 320.

The repair address generating circuit 310 generates a repair address signal in response to the write enable signal WE# or the read enable signal RE#, the address latch enable signal ALE, and the command latch enable signal CLE.

The repair control circuit 320 outputs the repair control signal RIO and the repair address signal RADD of FIG. 3 in response to the repair address signal.

Figure 5:
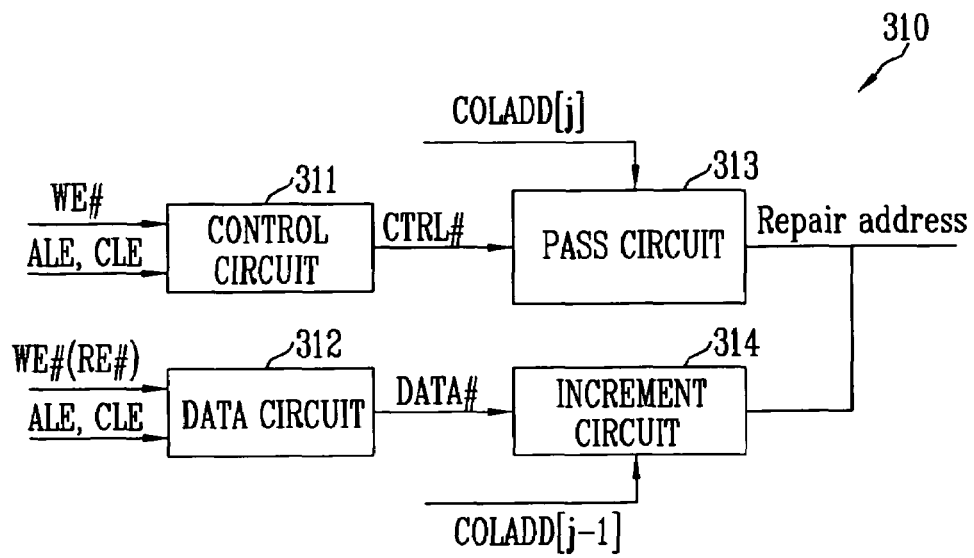
FIG. 5 is a block diagram of the repair address generating circuit shown in FIG. 4.
Figure 6:
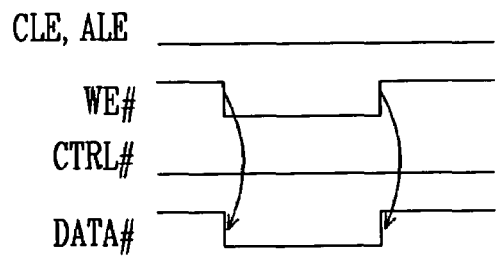
FIG. 6 is a timing diagram of signals illustrating the operation of the data circuit shown in FIG. 5.

FIG. 5 is a block diagram of the repair address generating circuit 310 of the semiconductor memory device according to an embodiment of the present invention.

The repair address generating circuit 310 includes a control circuit 311, a data circuit 312, a pass circuit 313, and an increment circuit 314.

The control circuit 311 outputs a control signal CTRL# in response to the write enable signal WE#, the address latch enable signal ALE, and the command latch enable signal CLE.

The data circuit 312 outputs a data signal DATA# in response to the address latch enable signal ALE, the command latch enable signal CLE, and the write enable signal WE# or the read enable signal RE#.

The pass circuit 313 outputs the column address signal COLADD[j] as the repair address in response to the control signal CTRL# and the column address signal COLADD[j] when the control signal CTRL# is logic low.

The increment circuit 314 receives the data signal DATA# and a previous column address signal COLADD[j−1], increases an address of the previous column address signal COLADD[j−1], and outputs it to the repair control circuit 320.

The pass circuit 313 may be constructed using a transmission gate or a decoding circuit. The increment circuit 314 may be constructed using a local address counter or a logic adder.

FIGS. 6 to 9 are timing diagrams of signals illustrating the repair operation of the semiconductor memory device according to an embodiment of the present invention. The process of generating the repair address of the semiconductor memory device according to an embodiment of the present invention will be described below with reference to FIGS. 6 to 9.

(1) The Case of Common Address Synchronized to Write Enable Signal WE# or Read Enable Signal RE#:

It is first assumed that a previous address is COLADD[j−1] and a current address is COLADD[j].

To input and output data for the current address, the write enable signal WE# or the read enable signal RE# falls to a low level. In a period in which the write enable signal WE# or the read enable signal RE# is a low level, the I/O of data is perform with respect to the current address cell.

If the write enable signal WE# or the read enable signal RE# rises to a high level, the address counter 200 detects the rising edge of the write enable signal WE# or the read enable signal RE# and increases the column address signal from COLADD[j−1] to COLADD[j].

A time which is taken for the write enable signal WE# or the read enable signal RE# to be transmitted from the input terminal 100 to the address counter 200 and a time which is taken for the address counter 200 to transmit the address signal COLADD[j−1] to the repair controller 300 after being activated are consumed (in total, a time of about Tadd is taken).

Figure 7:
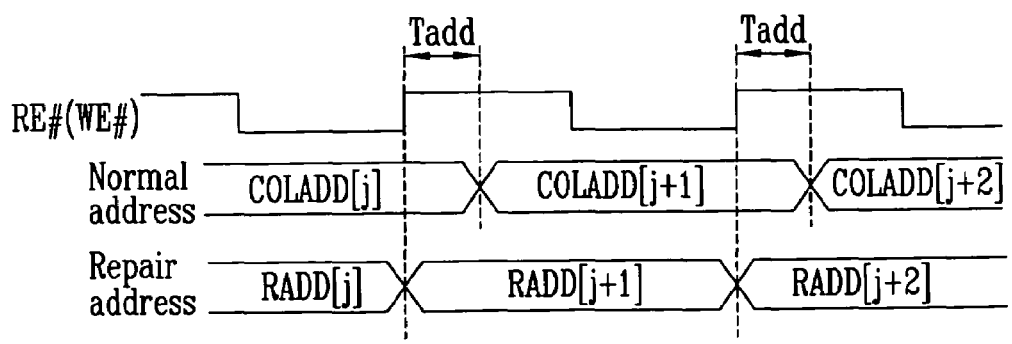
FIG. 7 is a timing diagram of signals illustrating the operation of the repair circuit shown in FIG. 3.

Accordingly, as shown in FIG. 7, the change of the internal address causes the write enable signal WE# or the read enable signal RE# to rise to a high level and the address is increased from COLADD[j] to COLADD[j+1] after a lapse of a predetermined time (Tadd).

The operation of the address generating circuit 310 of the repair controller 300 will be described below in detail.

The data circuit 312 of the repair address generating circuit 310 generates the data signal DATA# in response to the write enable signal WE# or the read enable signal RE#, the address latch enable signal ALE, and the command latch enable signal CLE. That is, referring to FIG. 6, when the address latch enable signal ALE and the command latch enable signal CLE are kept to a logic low and the write enable signal WE# or the read enable signal RE# shifts from a logic high to a logic low, the data signal DATA# of a logic low is output.

The increment circuit 314 outputs the repair address whose address has been increased in response to the data signal DATA# and the previous address signal COLADD[j−1]. Accordingly, the address counter 200 increases the address signal COLADD[j−1] that has been previously output through the increment circuit 314. Therefore, a time which is taken for the write enable signal WE# or the read enable signal RE# to be transmitted from the input terminal 100 to the address counter 200 and a time which is taken for the address counter 200 to transmit the address signal COLADD [j] to the repair controller 300 after being activated can be omitted.

Therefore, the repair controller can operate faster than the memory cell by the time (Tadd) which is taken for the address counter 200 to be activated and the time which is taken for the address counter 200 to transmit the address signal COLADD [j].

In the present embodiment, a time taken for data to be transmitted is smaller than the time (Tadd) which is taken for the address counter 200 to be activated, and is not considered accordingly. Furthermore, a time which is taken for the increment circuit 314 to increase the address is relatively small compared to the time which is taken for the write enable signal WE# or the read enable signal RE# to be input to the counter address 200 and for the increased address COLADD [j] to reach the general memory cell.

Accordingly, the operating speed of the repair cell becomes faster than that of the general memory cell.

(2) The Case where Start Address is Repaired:

In the case of the NAND flash memory device, the start address is input. The column address signal COLADD is first input. If the start address is an address that must be repaired, the control circuit 311 of the repair address generating circuit 310 generates the control signal CTRL# in response to the write enable signal WE#, the address latch enable signal ALE, and the command latch enable signal CLE, which are received from the input terminal 100 when a last row address signal ROWADD is input.

Figure 8:
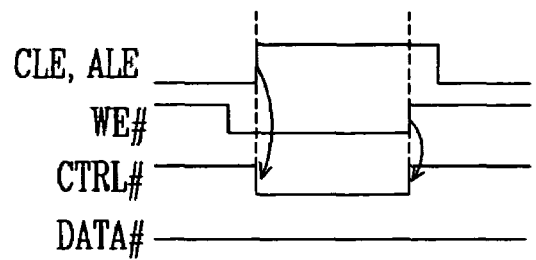
FIG. 8 is a timing diagram of signals illustrating the operation of the control circuit shown in FIG. 5.

Referring to FIG. 8, when the address latch enable signal ALE and the command latch enable signal CLE shift to a logic high and the write enable signal WE# shifts from a logic high to a logic low, the control signal DATA# of a logic low is output. The pass circuit 313 passes and outputs the address signal COLADD[j] in response to the control signal DATA# of the low level and the address signal COLADD[j].

Figure 9:
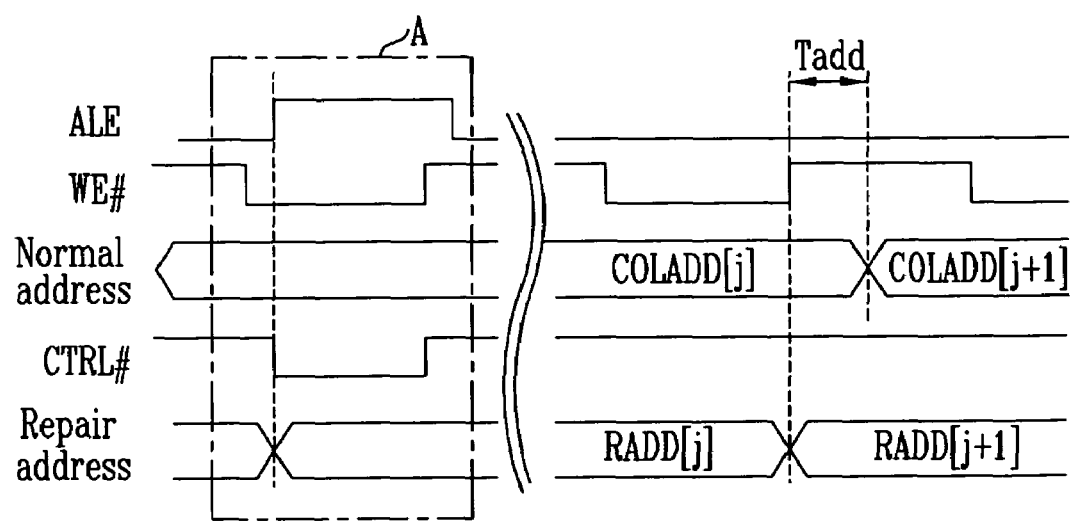
FIG. 9 is a timing diagram of signals illustrating the start address operation of the repair circuit shown in FIG. 3.

Referring to FIG. 9, in the data input, after the last row address ROWADD is input, there occurs a timing margin of one or more cycles (A in FIG. 9) until the write enable signal WE# or the read enable signal RE# is toggled for data I/O.

As described above, according to the present invention, if an address on which a repair operation must be performed occurs, the repair controller directly receives the write enable signal or the read enable signal and activates the repair controller earlier than a general cell using a previous address, thereby offsetting an operating time consumed in the repair controller. Therefore, the operating speed of the repair cell can become faster than that of the general cell and the operating speed of the device can be improved accordingly.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A repair circuit of a semiconductor memory device, comprising:
    an address counter that sequentially generates a first column address signal and a second column address signal in response to a write enable signal or a read enable signal;
    a repair controller that generates a repair column address signal earlier than the second column address signal in response to the first column address signal, an address latch enable signal, a command enable signal, and a write enable signal; and
    a repair scramble unit that selects a repair cell in response to a repair control signal and the repair column address signal.

2. The repair circuit as claimed in claim 1, wherein the repair controller comprises:
    a repair address generating circuit that generates a repair address signal in response to the previous column address signal, the address latch enable signal, the command enable signal, and the write enable signal or the read enable signal; and
    a repair control circuit that generates a repair column address signal in response to the repair address signal.

3. The repair circuit as claimed in claim 2, wherein the repair address generating circuit comprises:
    a control circuit that generates a control signal in response to the write enable signal, the address latch enable signal, and the command latch enable signal;
    a data circuit that generates a data signal in response to the address latch enable signal, the command latch enable signal, and the write enable signal or the read enable signal;
    a pass circuit that generates a first address signal in response to the control signal and the second column address signal; and
    an increment circuit that generates a second address signal in response to the data signal and the first column address signal.

4. The repair circuit as claimed in claim 3, wherein the pass circuit comprises a transmission gate or a decoding circuit.

5. The repair circuit as claimed in claim 3, wherein the increment circuit comprises a local address counter or a logic adder.

6. A method of selecting a repair cell of a semiconductor memory device comprising:
    generating a first column address signal;
    generating a second column address signal sequentially after the first column address signal;
    generating a repair column address signal before the second column address signal is generated, in response to the first column address signal, an address latch enable signal, a command enable signal, and a write enable signal; and
    selecting a repair cell in response to the repair column address signal.

* * * * *